(12) United States Patent
Tanimura

(10) Patent No.: US 12,078,659 B2
(45) Date of Patent: Sep. 3, 2024

(54) METHOD OF INSPECTING SEMICONDUCTOR DEVICE, SEMICONDUCTOR DEVICE, AND PROBE CARD

(71) Applicant: RENESAS ELECTRONICS CORPORATION, Tokyo (JP)

(72) Inventor: Masaaki Tanimura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 18/051,926

(22) Filed: Nov. 2, 2022

(65) Prior Publication Data

US 2024/0142497 A1    May 2, 2024

(51) Int. Cl.
*G01R 31/00* (2006.01)
*G01R 1/073* (2006.01)
*G01R 31/28* (2006.01)

(52) U.S. Cl.
CPC ..... *G01R 1/07342* (2013.01); *G01R 31/2874* (2013.01)

(58) Field of Classification Search
CPC .......... G01R 1/07342; G01R 31/2874
See application file for complete search history.

(56) References Cited

U.S. PATENT DOCUMENTS

| 2008/0018352 A1* | 1/2008 | Chiba | G01R 31/2865 324/750.04 |
|---|---|---|---|
| 2018/0174929 A1* | 6/2018 | Tamanoi | H01L 22/14 |
| 2021/0318354 A1* | 10/2021 | Hetsugi | G01R 1/06794 |
| 2024/0044720 A1* | 2/2024 | Du | G01K 7/226 |

FOREIGN PATENT DOCUMENTS

JP    2003-142537 A    5/2003

\* cited by examiner

*Primary Examiner* — Thang X Le
(74) *Attorney, Agent, or Firm* — Rimon P.C.

(57) ABSTRACT

A semiconductor device includes a temperature sensor circuit having a sensor element, internal circuits, sensor terminals connected to the sensor element, and normal terminals connected to the internal circuits. A semiconductor inspection apparatus inspects, by using a probe card having first probes and second probes, the semiconductor device mounted on a stage in a first state in which the first probe is in contact with the sensor terminal and the second probe is not in contact with the semiconductor device and in a second state in which the first probe is in contact with the sensor terminal and the second probe is in contact with the normal terminal. The semiconductor inspection apparatus measures an output value of the sensor element in the first state to calculate temperature characteristics of the sensor element, and grasps a temperature of the sensor element in the second state based on the temperature characteristics.

12 Claims, 12 Drawing Sheets

METHOD OF INSPECTING SEMICONDUCTOR DEVICE, SEMICONDUCTOR DEVICE, AND PROBE CARD

BACKGROUND

The present invention relates to a method of inspecting a semiconductor device, a semiconductor device, and a probe card, and relates to, for example, a technique of correcting a temperature sensor circuit mounted in a semiconductor device.

There is a disclosed technique listed below.
[Patent Document 1] Japanese Unexamined Patent Application Publication No. 2003-142537

Patent Document 1 (Japanese Unexamined Patent Application Publication No. 2003-142537) discloses a probe device for semiconductor inspection capable of applying uniform pressure to all the probes when probing electrode pads over a wide area. Specifically, a spacer having the same thickness as a wafer is installed around a wafer mounting region on the stage of the probe device. As a result, since the probe structure is pressed while facing both the wafer and the spacer, it is possible to prevent the probe structure from tilting with respect to the surface of the wafer.

SUMMARY

For example, a semiconductor device such as an SOC (System On a Chip) mounted with a temperature sensor circuit is widely used. By mounting the temperature sensor circuit, the temperature of the semiconductor device can be detected, and for example, it is possible to protect the semiconductor device from overheating or the like. In such semiconductor devices, the package form has shifted from QFP (Quad Flat Package) to FC-BGA (Flip Chip-Ball Grid Array) and the like with the recent increase in scale. Along with this, the terminals of the semiconductor device, that is, the electrode pads are arranged on the entire surface of the semiconductor device, in other words, the semiconductor chip, and the number of terminals has reached several thousand or more.

On the other hand, when inspecting a semiconductor wafer on which such semiconductor devices are formed, it is desired to correct the temperature characteristics of the temperature sensor circuit by trimming, LUT (Look Up Table), etc. based on the inspection results at each temperature. For this purpose, it is necessary to correctly grasp the actual temperature of the semiconductor device at the time of the inspection. However, it becomes more difficult to grasp the actual temperature of the semiconductor device as the number of terminals of the semiconductor device increases. Namely, the semiconductor device receives the heat applied from the temperature adjustment mechanism of the semiconductor inspection apparatus, and is further connected to a tester or the like installed in an ambient temperature environment or the like from each terminal through the probes. Therefore, as the number of terminals and thus the number of probes increase, the set temperature of the temperature adjustment mechanism becomes more difficult to match the actual temperature of the semiconductor device.

In addition to these factors, the set temperature of the temperature adjustment mechanism becomes more difficult to match the actual temperature of the semiconductor device also due to the increase in the amount of heat generated by the semiconductor device resulting from the increase in scale. Due to these factors, the actual temperature of the semiconductor device at the time of inspection cannot be correctly grasped, that is, the set temperature of the temperature adjustment mechanism cannot be regarded as the actual temperature of the semiconductor device, so that there is a fear that it becomes difficult to accurately correct the temperature characteristics of the temperature sensor circuit.

Other objects and novel features will be apparent from the description of this specification and accompanying drawings.

Then, a method of inspecting a semiconductor device according to an embodiment is a method using a semiconductor inspection apparatus. The semiconductor device includes a temperature sensor circuit which includes a sensor element whose output value changes depending on temperature and detects a temperature of the semiconductor device based on the output value of the sensor element, internal circuits for realizing various functions of the semiconductor device, sensor terminals connected to the sensor element, and normal terminals connected to the internal circuits. The semiconductor inspection apparatus inspects, by using a probe card in which first probes and second probes are provided, the semiconductor device mounted on a stage in a first state in which the first probe is in contact with the sensor terminal and the second probe is not in contact with the semiconductor device and in a second state in which the first probe is in contact with the sensor terminal and the second probe is in contact with the normal terminal. At this time, the semiconductor inspection apparatus sets temperature of the stage to two or more temperatures, measures the output value of the sensor element by using the first state at each of the temperatures, and regards the temperature of the stage as an actual temperature of the sensor element, thereby calculating actual temperature characteristics representing a relationship between the actual temperature of the sensor element and the output value of the sensor element. Further, the semiconductor inspection apparatus inspects the entire semiconductor device including measurement of the output value of the sensor element and acquisition of an output value of the temperature sensor circuit by using the second state at each of the temperatures and converts the output value of the sensor element into an actual temperature based on the actual temperature characteristics, thereby calculating a relationship between the actual temperature of the sensor element and the output value of the temperature sensor circuit.

By using the method of inspecting the semiconductor device according to the embodiment, the temperature characteristics of the temperature sensor circuit can be accurately corrected.

BRIEF DESCRIPTIONS OF THE DRAWINGS

DETAILED DESCRIPTION

Figure 1:
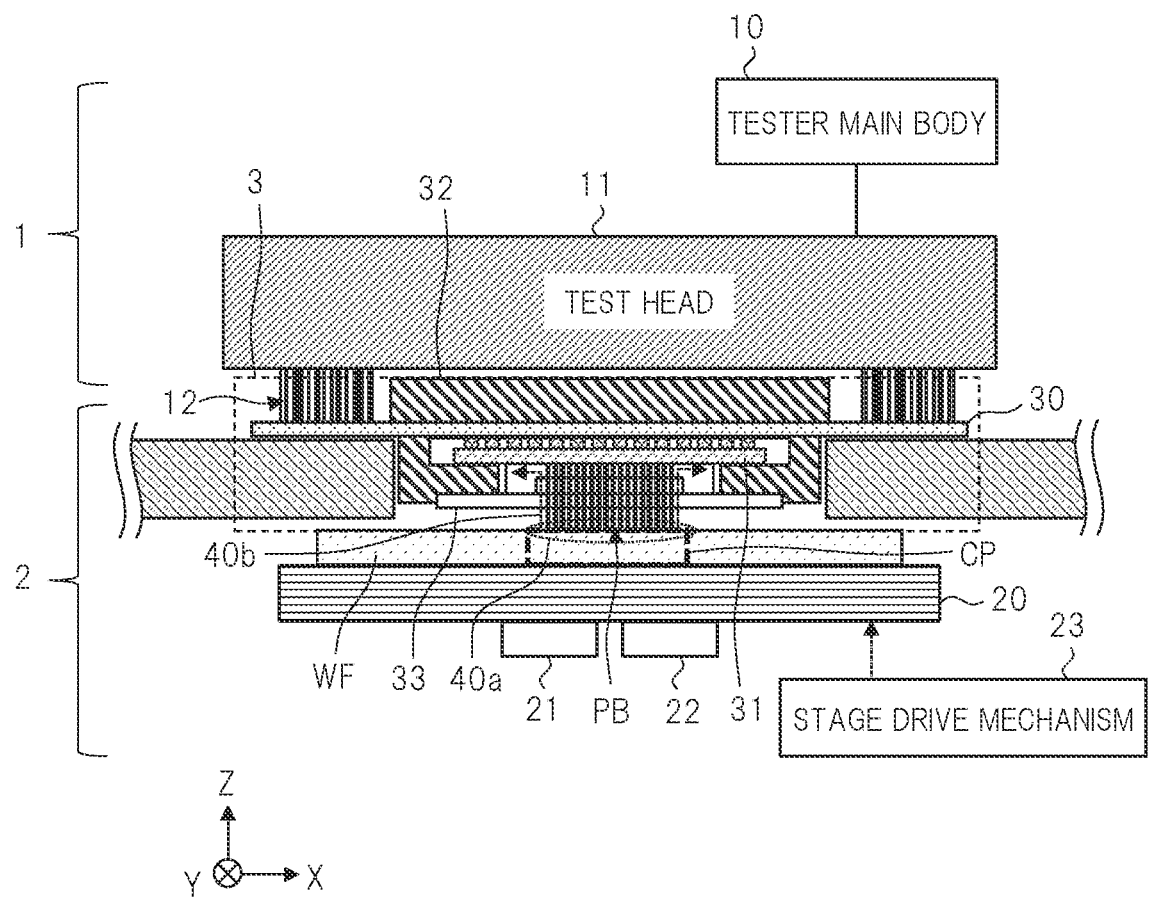
FIG. 1 is a schematic diagram showing a configuration example of a semiconductor inspection apparatus according to the first embodiment and a problem to be a premise.

In the embodiments described below, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specific number is also applicable.

Furthermore, in the embodiments described below, it goes without saying that each component (including an element step) is not indispensable unless otherwise clearly specified or unless it is obvious that the component is indispensable in principle. Likewise, in the embodiments described below, when mentioning a shape, a positional relation, or the like of a component, a substantially approximate shape, a similar shape, or the like is included unless otherwise clearly specified or unless it is obvious that the shape, the positional relation, or the like of the component differs in principle. The same applies to the above-described numerical value and range.

Hereinafter, embodiments of the present invention will be described in detail with reference to the drawings. Note that the members having the same function are denoted by the same reference characters throughout the drawings for describing the embodiments and the repetitive description thereof will be omitted. Also, in the following embodiments, the description of the same or similar components will not be repeated in principle unless particularly required.

First Embodiment

<Outline of Semiconductor Inspection Apparatus and Semiconductor Device and Problem to be Premise>

FIG. 1 is a schematic diagram showing a configuration example of a semiconductor inspection apparatus according to the first embodiment and a problem to be a premise. The semiconductor inspection apparatus shown in FIG. 1 includes a tester 1, a prober 2, and a probe card 3. The tester 1 includes a tester main body 10 and a test head 11. The test head 11 includes a driver that outputs a signal to the outside, a receiver that receives an input of signal from the outside, a power supply unit that can supply a power supply voltage or a power supply current to the outside and measure the power supply current or the power supply voltage, and the like. For example, the tester main body 10 controls the output signal from the driver or the power supply from the power supply unit based on a predetermined inspection program, and evaluates the input signal to the receiver, the measurement value in the power supply unit, and the like.

The prober 2 includes a stage 20 referred to as a wafer chuck or the like, a temperature adjustment mechanism 21, a temperature measurement unit 22, and a stage drive mechanism 23. A semiconductor wafer WF on which a plurality of semiconductor chips CP, in other words, semiconductor devices are formed is mounted on the stage 20. The temperature adjustment mechanism 21 includes a heater, a cooler, or the like, and heats or cools the stage 20. The temperature measurement unit 22 measures the temperature of the stage 20. The prober 2 controls the temperature adjustment mechanism 21 in accordance with the temperature measured by the temperature measurement unit 22, thereby controlling the stage 20 and thus the semiconductor wafer WF to a predetermined set temperature.

The probe card 3 is connected to the test head 11 via a test interface 12. The probe card 3 is detachably attached to the test head 11 or the prober 2. The probe card 3 includes a main board 30, a conversion board 31, a reinforcing plate 32, and a probe unit 33 in which a plurality of probes PB are provided. The reinforcing plate 32 connects the main board 30 and the conversion board 31 and fixes the connected state. The probe unit 33 is attached to the conversion board 31. The main board 30 has a plurality of wirings connecting between the test interface 12 and the conversion board 31, and transmits signals or power through the wirings. The conversion board 31 has a plurality of wirings connecting between the main board 30 and the plurality of probes PB, and transmits signals or power through the wirings.

The stage drive mechanism 23 in the prober 2 moves the stage 20 in the X-axis direction, the Y-axis direction, and the Z-axis direction. The amount of movement of the stage 20 in each axial direction can be arbitrarily set. In this specification, the planar direction of the semiconductor wafer WF or the planar direction of the stage 20 is defined as the X-axis direction and the Y-axis direction orthogonal to the X-axis direction, and the direction orthogonal to the X-axis direction and the Y-axis direction is defined as the Z-axis direction. When inspecting the semiconductor chip CP which is a device to be inspected, the stage drive mechanism 23 moves the stage 20 in the X-axis direction and the Y-axis direction, and then moves the stage 20 in the Z-axis direction such that the probes PB provided in the probe card 3 come into contact with the terminals of the semiconductor chip CP.

Figure 2:
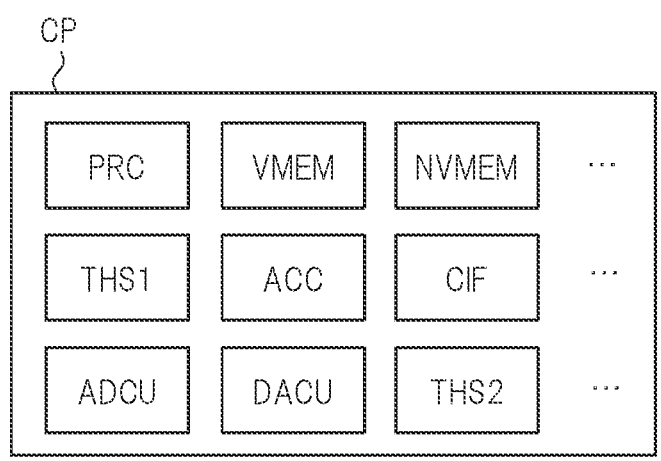
FIG. 2 is a schematic diagram showing a configuration example of the semiconductor device in FIG. 1.

FIG. 2 is a schematic diagram showing a configuration example of the semiconductor device in FIG. 1. The semiconductor device shown in FIG. 2, that is, the semiconductor chip CP is, for example, an SOC, and includes one or more, in this example, a plurality of temperature sensor circuits THS1 and THS2 and internal circuits for realizing various functions of the semiconductor device. In this specification, the plurality of temperature sensor circuits THS1 and THS2 are collectively referred to as the temperature sensor circuit THS.

The internal circuits include, for example, a processor PRC, memories, an accelerator ACC, a communication interface CIF, an analog-to-digital converter unit ADCU, a digital-to-analog converter unit DACU, and the like. The memories include a volatile memory VMEM such as SRAM or DRAM and a nonvolatile memory NVMEM such as a flash memory.

The plurality of temperature sensor circuits THS1 and THS2 detect temperatures at different positions in the semiconductor chip CP. The processor PRC is a CPU (Central Processing Unit), a DSP (Digital Signal Processor), a GPU (Graphics Processing Unit), or the like, and implements a predetermined function by executing a predetermined program stored in the memory. The accelerator ACC is a circuit that implements a dedicated function required for the semiconductor device. The communication interface CIF communicates with the outside of the device based on a predetermined communication protocol.

Figure 3A:
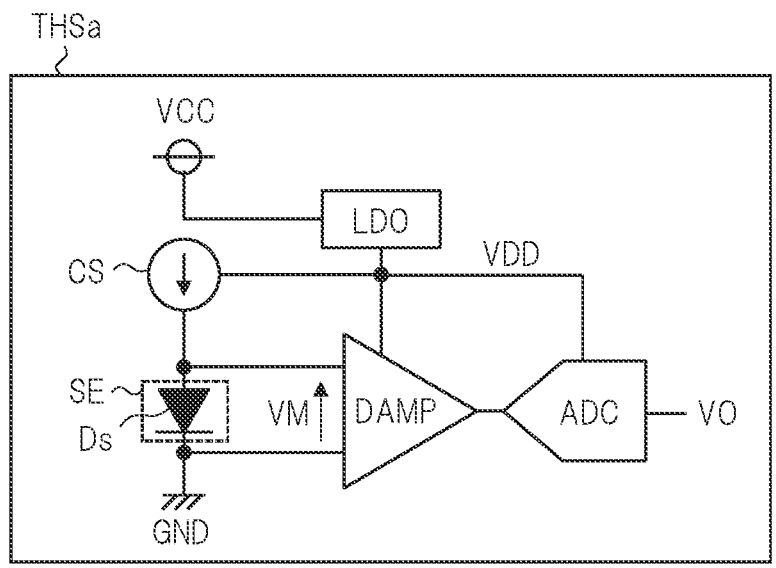
FIG. 3A is a circuit diagram showing a detailed configuration example of the temperature sensor circuit in FIG. 2.
Figure 3B:
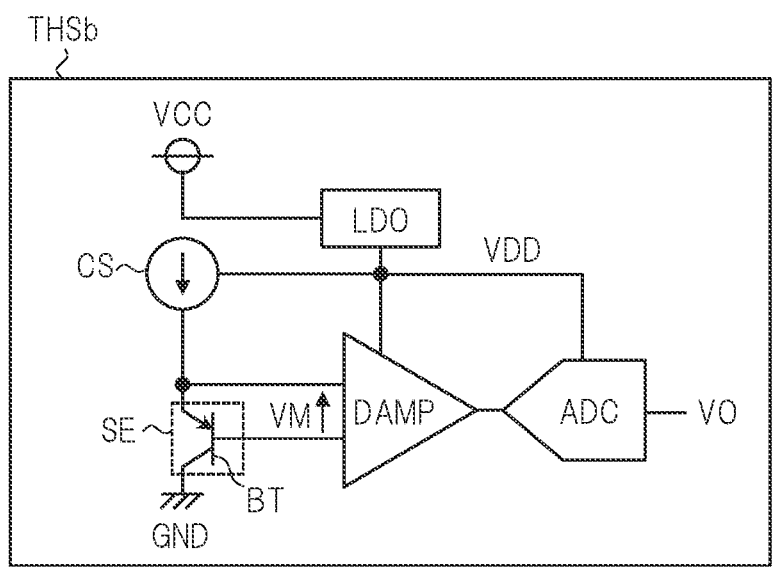
FIG. 3B is a circuit diagram showing another detailed configuration example of the temperature sensor circuit in FIG. 2.

FIG. 3A and FIG. 3B are circuit diagrams each showing a detailed configuration example of the temperature sensor circuit in FIG. 2. A temperature sensor circuit THSa shown in FIG. 3A includes a current source CS, a diode Ds as an example of a sensor element SE, a differential amplifier DAMP, a power supply regulator LDO, and an analog-to-digital converter ADC. The current source CS supplies a constant current to the diode Ds. The diode Ds supplied with a constant current generates an output value VM in accordance with temperature, here, an output voltage. A temperature coefficient of the diode Ds is, for example, −2 mV/° C.

The differential amplifier DAMP amplifies the output value VM of the diode Ds with a fixed gain. The analog-to-digital converter ADC converts an analog signal output from the differential amplifier DAMP into an output value VO to be a digital signal. The semiconductor chip CP grasps its own temperature based on the output value VO from the temperature sensor circuit THSa thus obtained. The power supply regulator LDO generates an internal power supply voltage VDD from an external power supply voltage VCC, and supplies the internal power supply voltage VDD to the current source CS, the differential amplifier DAMP, and the analog-to-digital converter ADC.

The temperature sensor circuit THSb shown in FIG. 3B differs from the temperature sensor circuit THSa in FIG. 3A in the configuration of the sensor element SE. Namely, in FIG. 3B, a pnp bipolar transistor BT is used as the sensor element SE, and the output value VM of the sensor element SE is the base-emitter voltage of the bipolar transistor BT. Although the diode Ds or the like is used as the sensor element SE in this example, it is not limited to this, and a thermistor element or the like whose resistance value changes in accordance with the temperature may be used depending on the cases. In this case, a method of applying a current to detect a voltage or a method of applying a voltage to detect a current can be applied to the sensor element SE.

Here, particularly in the semiconductor chip CP such as the SOC shown in FIG. 2, a large number of inspection terminals such as electrode pads are arranged on the entire surface of the semiconductor chip CP as it becomes multifunctional and increases in scale. The number of inspection terminals is, for example, one thousand or more, and may be several thousand in some cases. For this reason, when inspecting the semiconductor chip CP by using the semiconductor inspection apparatus shown in FIG. 1, a large number of probes PB respectively connected to a large number of inspection terminals are required. The probe PB is made of a conductive material with relatively low thermal resistance.

On the other hand, during the inspection shown in FIG. 1, it is desired to correct the temperature characteristics of the temperature sensor circuit THS in addition to the inspection of the internal circuits described above. Specifically, for example, in the state where the stage 20 is set to a predetermined set temperature by using the temperature adjustment mechanism 21, the output value VO of the temperature sensor circuit THS is obtained. Then, the set temperature of the stage 20 is regarded as the actual temperature of the semiconductor chip CP and the set temperature is associated with the output value VO of the temperature sensor circuit THS.

However, in practice, it may be difficult to regard the set temperature of the stage 20 as the actual temperature of the semiconductor chip CP due to the two factors (1) and (2). As the factor (1), heat generation 40a of the semiconductor chip CP during inspection increases as the scale of the semiconductor chip CP increases. In this case, the actual temperature of the semiconductor chip CP acts to be higher than the set temperature of the stage 20. As the factor (2), heat conduction 40b between the semiconductor chip CP and the test head 11 installed in the ambient temperature environment is more likely to occur as the number of probes PB increases. In this case, the actual temperature of the semiconductor chip CP acts to approach the ambient temperature. Therefore, it is beneficial to use the method of the embodiment described below.

<Details of Probe Card>

Figure 4:
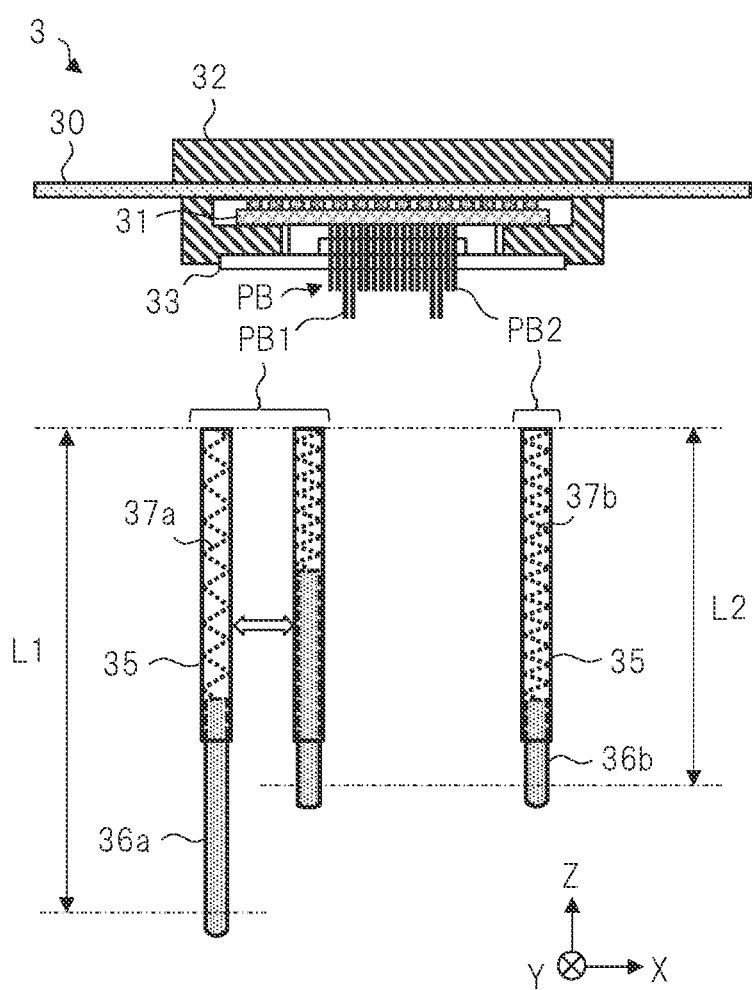
FIG. 4 is a cross-sectional view showing a detailed configuration example of the probe card in FIG. 1.

FIG. 4 is a cross-sectional view showing a detailed configuration example of the probe card in FIG. 1. FIG. 4 shows the probe card 3 similar to that in FIG. 1. Here, the probe card 3 shown in FIG. 4 has two types of probes PB1 and PB2 as the probes PB shown in FIG. 1. The length of the probe PB1 can be set to a length L1 and a length L2 shorter than the length L1. On the other hand, the length of the probe PB2 is not set to the length L1, but is set to the length L2.

As a specific configuration example, the probe PB1 includes a barrel 35, a spring 37a housed in the barrel 35, and a plunger 36a which is inserted into the barrel 35 and whose insertion amount is limited by the spring 37a. By adjusting the insertion amount of the plunger 36a into the barrel 35 by the stage drive mechanism 23 shown in FIG. 1, the length of the probe PB1 is set to the length L1 or the length L2.

Similarly, the probe PB2 also includes a barrel 35, a spring 37b housed in the barrel 35, and a plunger 36b which is inserted into the barrel 35 and whose insertion amount is limited by the spring 37b. The barrel 35 of the probe PB2 has the same length as that of the barrel 35 of the probe PB1. On the other hand, a spring harder than the spring 37a of the probe PB1, that is, a spring having a larger spring constant is used as the spring 37b of the probe PB2. Further, the plunger 36b of the probe PB2 has a length shorter than that of the plunger 36a of the probe PB1. Due to such a difference in configuration, the probe PB2 is set only to the length L2 by the stage drive mechanism 23 shown in FIG. 1.

Here, for example, the probe PB1 is provided for the contact with a sensor terminal connected to the sensor element SE in the temperature sensor circuit THS. On the other hand, the probe PB2 is provided for the contact with a normal terminal connected to the internal circuit described with reference to FIG. 2. Therefore, for example, the number of probes PB1 may be a few while the number of probes PB2 may be one thousand or more.

Figure 5A:
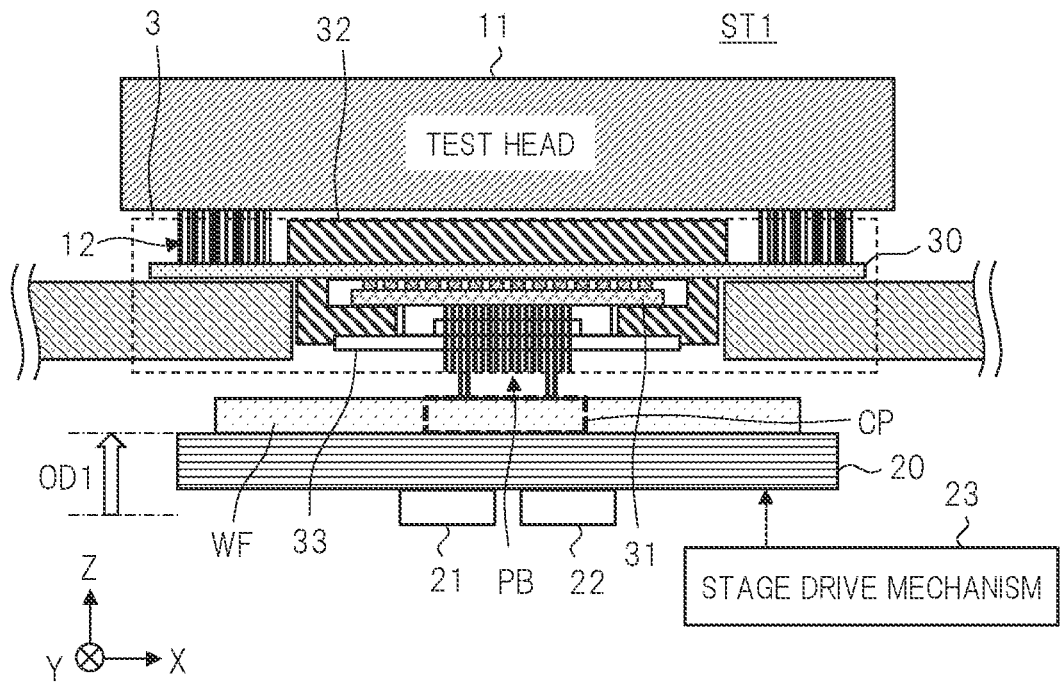
FIG. 5A is a diagram showing an example of an inspection state of a semiconductor device in the case of using the probe card shown in FIG. 4.
Figure 5B:
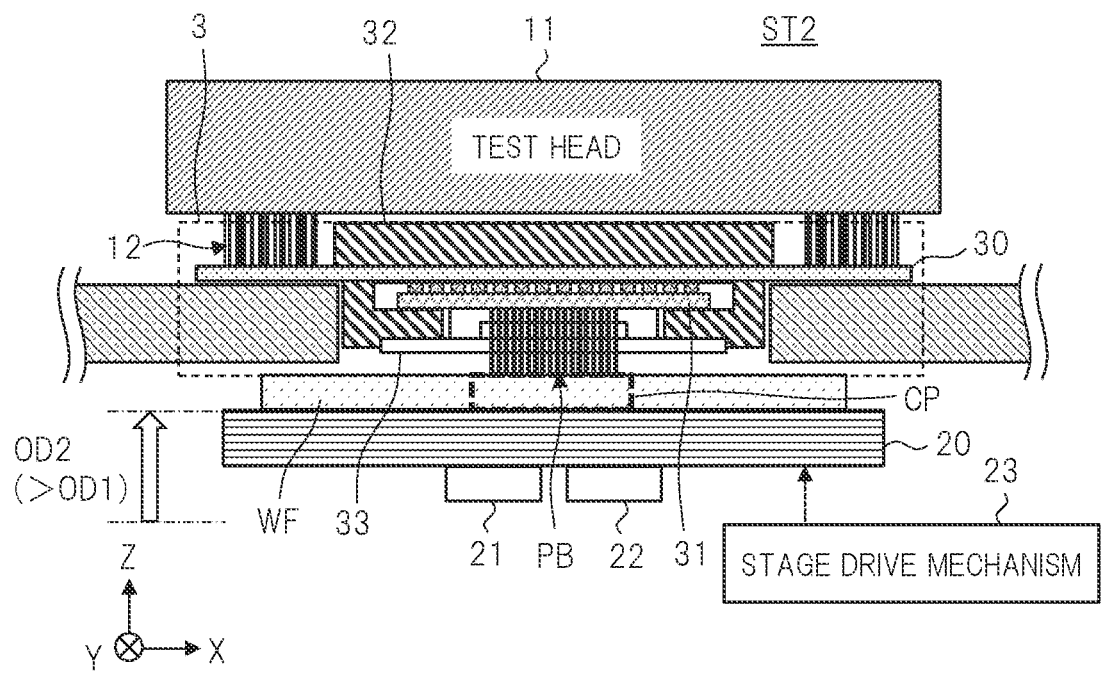
FIG. 5B is a diagram showing another example of an inspection state of a semiconductor device in the case of using the probe card shown in FIG. 4.

FIG. 5A and FIG. 5B are diagrams each showing an example of an inspection state of a semiconductor device in the case of using the probe card shown in FIG. 4. FIG. 5A and FIG. 5B show the configuration similar to that of the semiconductor inspection apparatus shown in FIG. 1. However, in FIG. 5A, a state ST1 in which the probe PB1 is in contact with the sensor terminal of the semiconductor chip CP and the probe PB2 is not in contact with the normal terminal of the semiconductor chip CP is established by setting the length of the probe PB1 to the length L1. Also, in FIG. 5B, a state ST2 in which the probe PB1 is in contact with the sensor terminal of the semiconductor chip CP and the probe PB2 is in contact with the normal terminal of the semiconductor chip CP is established by setting the lengths of both the probes PB1 and PB2 to the length L2.

Specifically, the stage drive mechanism 23 establishes the state ST1 shown in FIG. 5A by moving the stage 20 based on the overdrive amount OD1 representing the preset movement amount in the Z-axis direction. Similarly, the stage drive mechanism 23 establishes the state ST2 shown in FIG. 5B by moving the stage 20 based on the overdrive amount OD2 larger than the overdrive amount OD1 in the case of FIG. 5A.

Here, in the state ST1 shown in FIG. 5A, the number of probes PB in contact with the semiconductor chip CP is extremely small compared with the state ST2 shown in FIG. 5B. Therefore, it is possible to eliminate the factor (2) described with reference to FIG. 1 and FIG. 2, that is, it is possible to suppress the heat conduction 40b through the probe PB. Furthermore, in the state ST1 shown in FIG. 5A, the operating circuit is limited to the temperature sensor circuit THS, specifically, the sensor element SE therein unlike the state ST2 shown in FIG. 5B. Therefore, it is possible to eliminate the factor (1) described with reference to FIG. 1 and FIG. 2, that is, it is possible to suppress the heat generation 40a of the semiconductor chip CP.

As a result, in the state ST1, the set temperature of the stage 20 can be regarded as the actual temperature of the semiconductor chip CP. Further, it is possible to calculate the actual temperature characteristics representing the relationship between the output value VM of the temperature sensor circuit THS, more specifically, the sensor element SE therein and the actual temperature of the sensor element SE and thus the semiconductor chip CP. On the other hand, in the state ST2 shown in FIG. 5B, it may be difficult to regard the set temperature of the stage 20 as the actual temperature of the semiconductor chip CP as described with reference to FIG. 1 and FIG. 2. However, in the state ST2, by measuring the output value VM of the sensor element SE via the probe PB1, the output value VM can be converted into the actual temperature based on the actual temperature characteristics of the sensor element SE calculated in the state ST1. This makes it possible to accurately grasp the temperature of the semiconductor chip CP even in the state ST2.

In this way, since it is possible to accurately grasp the temperature of the semiconductor chip CP, the temperature characteristics of the temperature sensor circuit THS can be accurately corrected. As a specific correction method, for example, a method of mounting a fuse in the temperature sensor circuit THS and physically adjusting the resistance value of the sensor element SE by laser trimming or fuse cutting can be presented. Alternatively, a method of correcting a conversion table or a conversion formula used when converting the output value VO of the temperature sensor circuit THS into temperature can be presented. The conversion table can be realized by, for example, an LUT (Look Up Table). The conversion formula can be realized by, for example, a memory that stores parameters such as gain and offset included in the conversion formula. In this case, the processor is just required to perform the process of converting the output value VO into temperature by using the conversion formula.

In this example, the actual temperature characteristics representing the relationship between the output value VM of the sensor element SE in the temperature sensor circuit THS and the actual temperature are calculated in the state ST1. However, the actual temperature characteristics representing the relationship between the output value VO of the temperature sensor circuit THS and the actual temperature may be calculated depending on the cases. In this case, for example, it is only necessary to provide a mechanism capable of operating only the temperature sensor circuit THS and acquiring the output value VO thereof in the semiconductor chip CP and to provide a terminal necessary for it as the sensor terminal.

However, when calculating the actual temperature characteristics of the temperature sensor circuit THS in the state ST1, there is a fear that the number of required sensor terminals may increase and the heat generation may increase because the entire temperature sensor circuit THS operates, as compared with the case of calculating the actual temperature characteristics of the sensor element SE. From this point of view, it is desirable to calculate in the state ST1 the actual temperature characteristics of the sensor element SE instead of the actual temperature characteristics of the temperature sensor circuit THS.

<Method of Inspecting Semiconductor Device>

Figure 6:
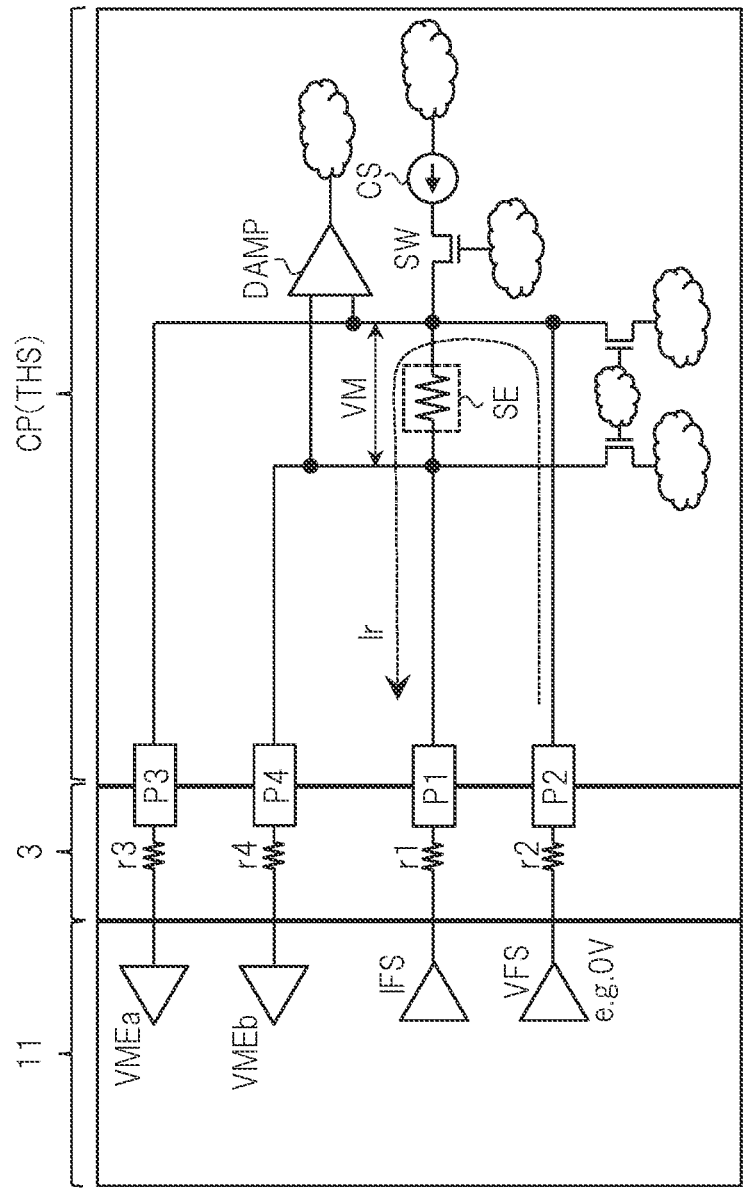
FIG. 6 is an equivalent circuit diagram for describing an example of a detailed inspection method in the state shown in FIG. 5A.

FIG. 6 is an equivalent circuit diagram for describing an example of a detailed inspection method in the state shown in FIG. 5A. FIG. 6 shows a part of the test head 11, a part of the probe card 3, and a part of the temperature sensor circuit THS in the semiconductor chip CP. The semiconductor chip CP is provided with, for example, four sensor terminals P1 to P4. The sensor terminals P1 and P2 are terminals connected to both ends of the sensor element SE, respectively, for applying a bias to the sensor element SE from the outside. The sensor terminals P3 and P4 are terminals connected to both ends of the sensor element SE, respectively, for externally measuring the output value VM generated in the sensor element SE in response to the application of the bias.

The probe card 3 connects the four sensor terminals P1 to P4 and the test head 11 via the probes PB1. Parasitic resistances r1 to r4 result from this connection and represent the resistance of the probes PB1, the wiring resistance on each board, the contact resistance at each location, and the like. The test head 11 includes power supply units IFS and VFS and receivers VMEa and VMEb. The power supply units IFS and VFS supply constant current Ir to the sensor element SE via the parasitic resistances r1 and r2 and the sensor terminals P1 and P2. At this time, the power supply unit IFS functions as a current source, and the power supply unit VFS functions as a voltage source that fixes the sensor terminal P2 to a predetermined voltage, for example, 0 V.

On the other hand, the receivers VMEa and VMEb receive the input of the output value VM of the sensor element SE, more specifically, the output voltage generated at both ends of the sensor element SE via the sensor terminals P3 and P4 and the parasitic resistors r3 and r4, and measure the value of the output voltage. Such a measurement method is referred to as a four-terminal method. By using the four-terminal method, the constant current Ir can be supplied without being affected by the parasitic resistances r1 and r2, and the output value VM of the sensor element SE can be measured without being affected by the parasitic resistances r3 and r4. Namely, if the same measurement is performed with only two terminals, an error due to parasitic resistance may occur.

Note that the constant current Ir by the power supply unit IFS is set to, for example, the same value as the constant current from the current source CS in the temperature sensor circuit THS. Also, the current source CS and the differential amplifier DAMP in the temperature sensor circuit THS are in a non-operating state because power is not supplied. However, in this example, a switch SW that is off by default is inserted between the current source CS and the sensor element SE in order to cut off the leakage path of the constant current Ir to such non-operating portions. Also, if there is another leakage path of the constant current Ir, a switch is inserted in the same manner.

Figure 7:
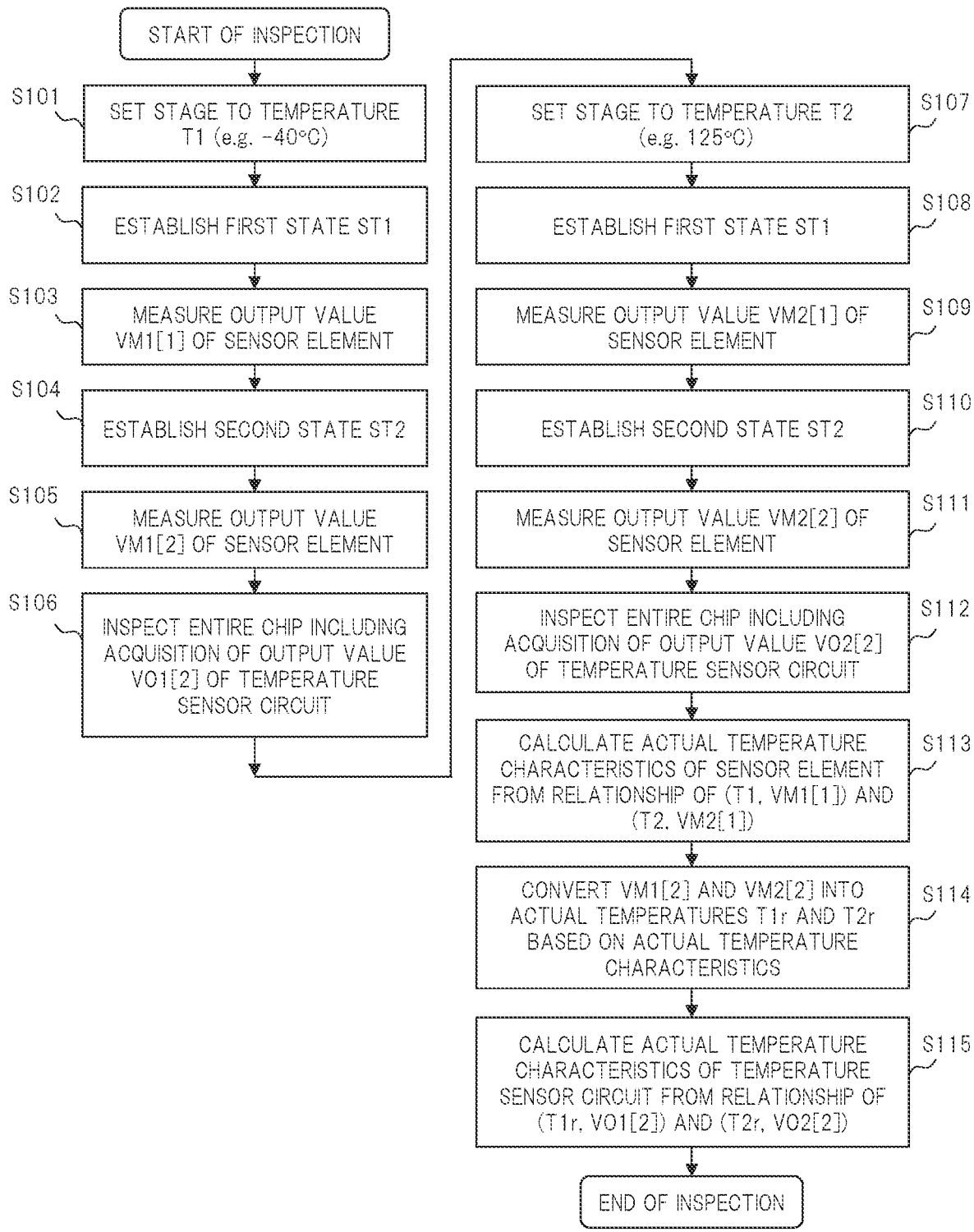
FIG. 7 is a flow diagram showing an example of the method of inspecting the semiconductor device according to the first embodiment.
Figure 8:
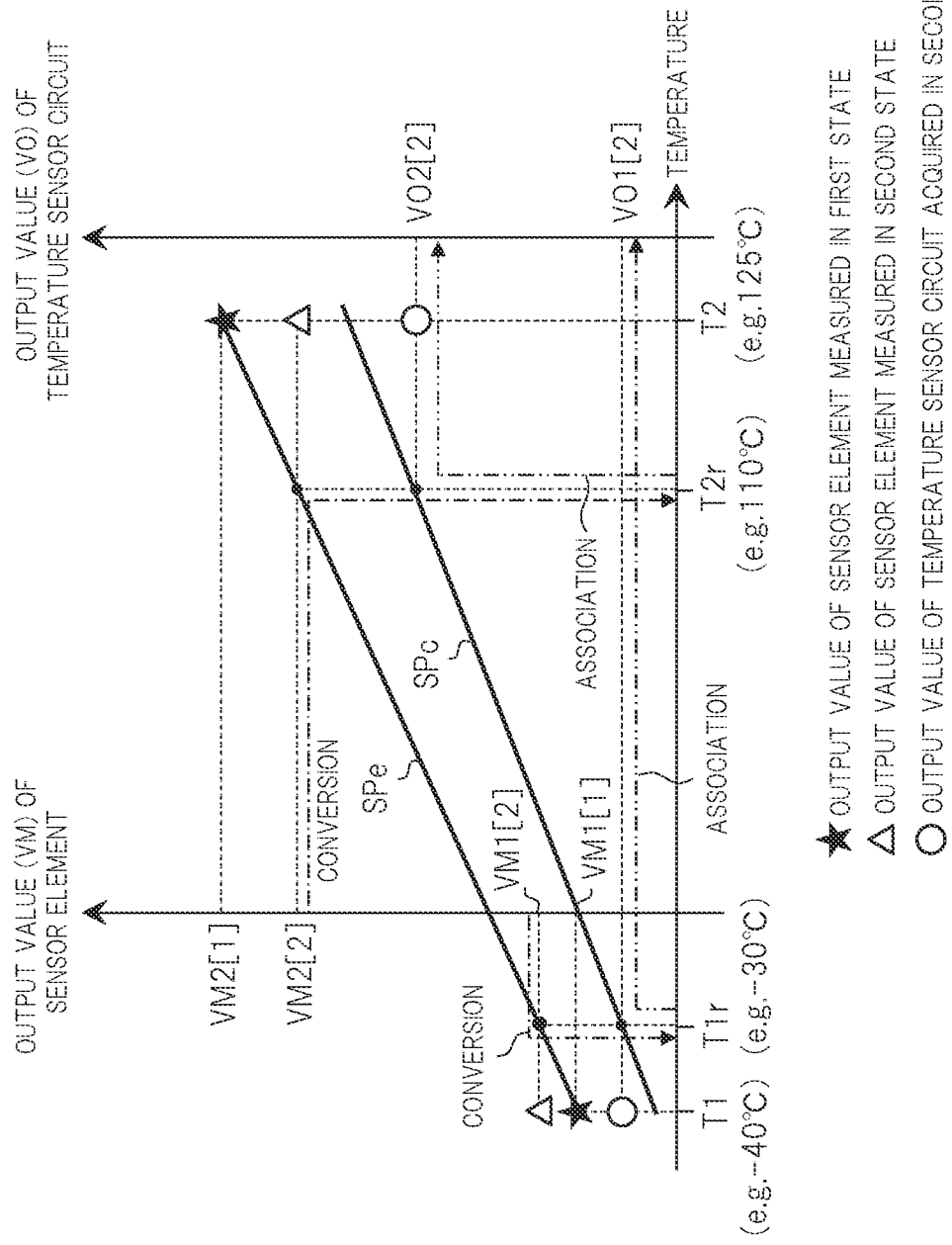
FIG. 8 is a schematic diagram for describing the contents in the process shown in FIG. 7.

FIG. 7 is a flow diagram showing an example of the method of inspecting the semiconductor device according to the first embodiment. FIG. 8 is a schematic diagram for describing the contents in the process shown in FIG. 7. FIG. 8 shows the relationship between the temperature and the output value VM of the sensor element SE and the output value VO of the temperature sensor circuit THS. In FIG. 7, first, the prober 2 sets the stage 20 to a predetermined set temperature T1, for example, −40° C. by using the temperature adjustment mechanism 21 (step S101). Next, the prober 2 establishes the state ST1 shown in FIG. 5A by using the stage drive mechanism 23 (step S102). By using this state ST1, the tester 1 measures the output value VM1[1] of the sensor element SE via the probes PB1 and the sensor terminals P1 to P4 (step S103).

Subsequently, the prober 2 establishes the state ST2 shown in FIG. 5B by using the stage drive mechanism 23 (step S104). By using this state ST2, the tester 1 measures the output value VM1[2] of the sensor element SE via the probes PB1 and the sensor terminals P1 to P4 (step S105). In parallel with this, the tester 1 performs the inspection of the entire semiconductor chip CP, that is, the inspection of the internal circuits described with reference to FIG. 2, including acquisition of the output value VO1[2] of the temperature sensor circuit THS via the probes PB2 and the normal terminals (step S106).

Thereafter, the prober 2 sets the stage 20 to a predetermined set temperature T2, for example, 125° C. by using the temperature adjustment mechanism 21 (step S107). Next, the prober 2 establishes the state ST1 shown in FIG. 5A by using the stage drive mechanism 23 (step S108). By using this state ST1, the tester 1 measures the output value VM2[1] of the sensor element SE via the probes PB1 and the sensor terminals P1 to P4 (step S109).

Subsequently, the prober 2 establishes the state ST2 shown in FIG. 5B by using the stage drive mechanism 23 (step S110). By using this state ST2, the tester 1 measures the output value VM2[2] of the sensor element SE via the probes PB1 and the sensor terminals P1 to P4 (step S111).

In parallel with this, the tester 1 performs the inspection of the entire semiconductor chip CP, that is, the inspection of the internal circuits described with reference to FIG. 2 including acquisition of the output value VO2[2] of the temperature sensor circuit THS via the probes PB2 and the normal terminals (step S112).

Thereafter, the tester 1 calculates the actual temperature characteristics SPe of the sensor element SE shown in FIG. 8 based on the output value VM of the sensor element SE in the state ST1, that is, the output value VM1[1] at the set temperature T1 (step S103) and the output value VM2[1] at the set temperature T2 (step S109) (step S113). The actual temperature characteristics SPe of the sensor element SE represent the relationship between the actual temperature of the sensor element SE and thus the semiconductor chip CP and the output value VM of the sensor element SE. Further, when calculating the actual temperature characteristics SPe, the tester 1 regards the set temperatures T1 and T2 as the actual temperature of the sensor element SE.

Next, the tester 1 converts the output value VM of the sensor element SE in the state ST2, that is, the output value VM1[2] at the set temperature T1 (step S105) and the output value VM2[2] at the set temperature T2 (step S111) into actual temperatures T1r and T2r based on the actual temperature characteristics SPe of the sensor element SE calculated in step S113 (step S114). Namely, at this time, the tester 1 does not regard the set temperatures T1 and T2 as the actual temperature of the sensor element SE.

Subsequently, the tester 1 associates the output value VO of the temperature sensor circuit THS in the state ST2, that is, the output value VO1[2] at the set temperature T1 (step S106) and the output value VO2[2] at the set temperature T2 (step S112) with the actual temperatures T1r and T2r converted in step S114, respectively. Then, based on this association, the tester 1 calculates the actual temperature characteristics SPc of the temperature sensor circuit THS shown in FIG. 8 (step S115). The actual temperature characteristics SPc of the temperature sensor circuit THS represent the relationship between the actual temperature of the sensor element SE and thus the semiconductor chip CP and the output value VO of the temperature sensor circuit THS. The actual temperature characteristics SPc of the temperature sensor circuit THS are stored in, for example, the memory shown in FIG. 2, and are used when converting the output value VO of the temperature sensor circuit THS into an actual temperature in actual use.

In FIG. 8, in the state ST2, the actual temperature T1r with respect to the set temperature T1 of −40° C. is −30° C. and the actual temperature T2r with respect to the set temperature T2 of 125° C. is 110° C. In this example, the error between the set temperature and the actual temperature increases as getting away from ambient temperature such as 25° C. Also, here, the actual temperature characteristics SPe and SPc are calculated as the primary characteristics by performing the inspection at two set temperatures T1 and T2. However, the actual temperature characteristics SPe and SPc may be calculated by, for example, performing the inspection at three or more set temperatures instead of the two set temperatures and performing linear approximation at three or more points. Alternatively, the approximation to other characteristics is also possible in addition to the primary characteristics.

Figure 9:
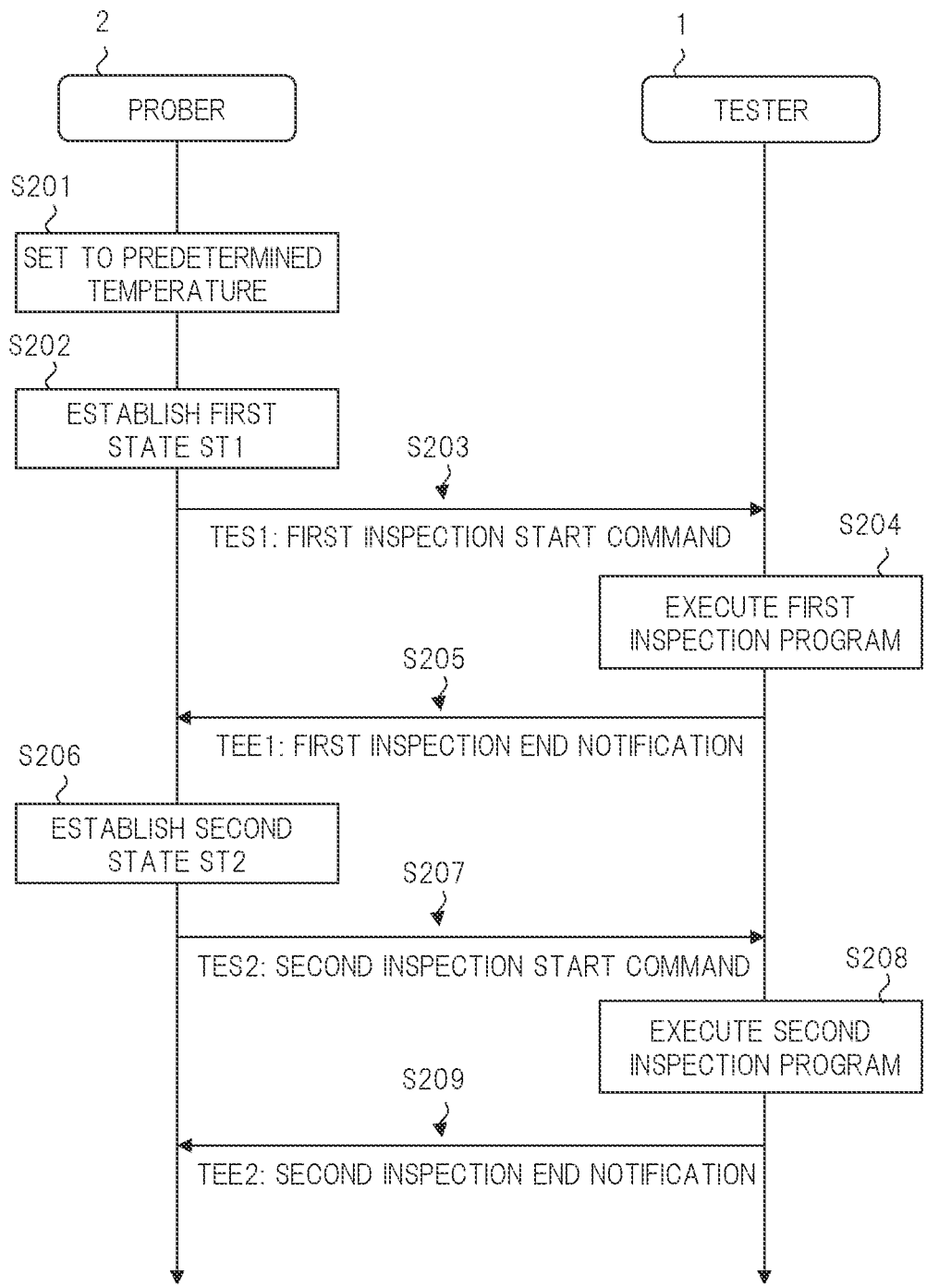
FIG. 9 is a sequence diagram showing an example of a main processing procedure between the tester and the prober in the semiconductor inspection apparatus shown in FIG. 1.

FIG. 9 is a sequence diagram showing an example of a main processing procedure between the tester and the prober in the semiconductor inspection apparatus shown in FIG. 1. As a premise, the tester 1 and prober 2 are connected via a communication line based on a predetermined communication protocol. In FIG. 9, the prober 2 sets the stage 20 to a predetermined temperature, for example, the temperature T1 in FIG. 7 by using the temperature adjustment mechanism 21 (step S201).

Subsequently, the prober 2 establishes the first state ST1 by driving the stage 20 with the stage drive mechanism 23 while setting a certain semiconductor chip CP on the semiconductor wafer WF as a device to be inspected (step S202). When the first state ST1 is established, the prober 2 transmits a first inspection start command TES1 to the tester 1 via the communication line (step S203).

The tester 1 executes a first inspection program in response to the first inspection start command TES1 from the prober 2, thereby measuring the output value VM of the sensor element SE in the device to be inspected (step S204). Then, after measuring the output value VM of the sensor element SE, the tester 1 transmits a first inspection end notification TEE1 to the prober 2 (step S205).

The prober 2 establishes the second state ST2 in response to the first inspection end notification TEE1 from the tester 1 while setting the same semiconductor chip CP as the device to be inspected (step S206). When the second state ST2 is established, the prober 2 transmits a second inspection start instruction TES2 to the tester 1 (step S207). The tester 1 executes a second inspection program in response to the second inspection start command TES2 from the prober 2, thereby inspecting the entire device to be inspected including the measurement of the output value VM of the sensor element SE in the device to be inspected and the acquisition of the output value VO of the temperature sensor circuit THS (step S208).

Then, after finishing the inspection of the entire device to be inspected, the tester 1 transmits a second inspection end notification TEE2 to the prober 2 (step S209). Upon receiving the second inspection end notification TEE2 from the tester 1, the prober 2 establishes the first state ST1 while setting the next semiconductor chip CP on the same semiconductor wafer WF as the device to be inspected. In this way, the tester 1 and the prober 2 repeat the process of steps S202 to S209 until the inspection of the entire semiconductor wafer WF is finished.

Further, when the inspection of the entire semiconductor wafer WF is finished and the inspection at a different temperature is performed, the prober 2 sets the stage 20 to a different temperature, for example, the temperature T2 in FIG. 7 by using the temperature adjustment mechanism 21. In this way, the tester 1 and the prober 2 repeat the process of step S201 to step S209 until the inspection at all temperatures is finished. By using such a processing procedure, it becomes possible to perform the inspection using the first state ST1 and the second state ST2 shown in FIG. 7 for the entire semiconductor wafer WF.

Main Effect of First Embodiment

As described above, in the method of the first embodiment, the first state in which only the sensor element is probed and the second state in which the entire semiconductor device is probed can be established by using the probe card in which two types of probes having different lengths are provided. Then, by using the first state, the actual temperature characteristics of the sensor element can be accurately calculated, and the actual temperature of the sensor element can be accurately grasped even in the second state based on the actual temperature characteristics.

As a result, the temperature characteristics of the temperature sensor circuit in the semiconductor device can be accurately corrected. In particular, the accurate correction can be realized even in large-scale semiconductor devices that causes a large amount of heat generation and increase in the number of probes. Then, by accurately correcting the temperature sensor circuit, for example, it becomes possible to appropriately protect the semiconductor device from overheating or the like, that is, without causing over-engineering and under-engineering.

Second Embodiment

<Configuration of Semiconductor Device>

Figure 10:
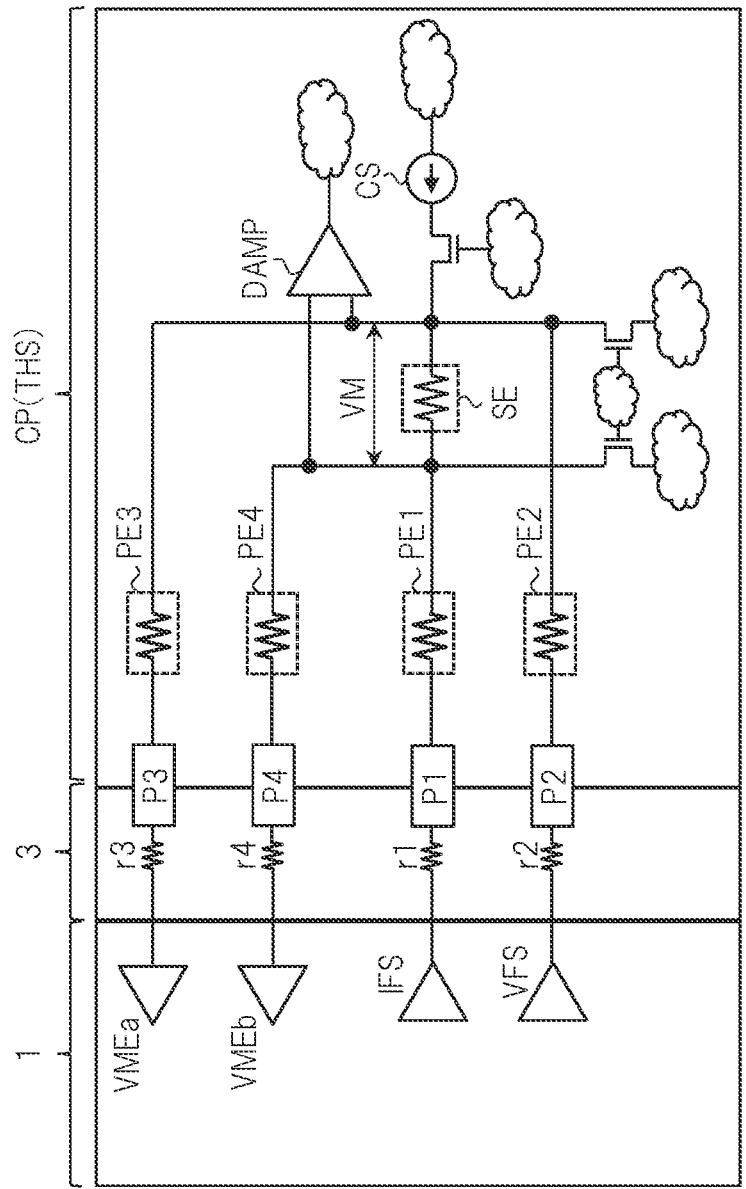
FIG. 10 is a circuit diagram showing a configuration example of a main part related to a temperature sensor circuit in a semiconductor device according to the second embodiment.

FIG. 10 is a circuit diagram showing a configuration example of a main part related to a temperature sensor in a semiconductor device according to the second embodiment. FIG. 10 shows the temperature sensor circuit THS and the sensor terminals P1 to P4 similar to those of the case in FIG. 6. However, unlike the configuration example of FIG. 6, the semiconductor device shown in FIG. 10, that is, the semiconductor chip CP includes ESD (Electro Static Discharge) protection elements PE1 to PE4. The ESD protection elements PE1 to PE4 are inserted in series in the wiring between the sensor element SE and the sensor terminals P1 to P4, respectively.

In general, an ESD protection element is provided for an external terminal as a product. On the other hand, the sensor terminals P1 to P4 are, for example, inspection terminals and do not belong to the external terminal as a product. However, since there is a possibility that static electricity is applied to the sensor terminals P1 to P4 via the probes PB1 of the probe card 3 during inspection, the ESD protection elements PE1 to PE4 are provided in this example.

Here, the ESD protection element for the external terminal is usually composed of a clamp element or the like connected between the external terminal and the power supply. However, if such clamp elements are provided at the sensor terminals P1 to P4, it may become difficult to measure the output value VM of the sensor element SE. Therefore, in the example of FIG. 10, the ESD protection elements PE1 to PE4 are composed of high resistance elements or the like inserted in series in the wiring. Even when the high resistance element is used, the output value VM of the sensor element SE can be accurately measured by using the four-terminal method described in the first embodiment.

Figure 11A:
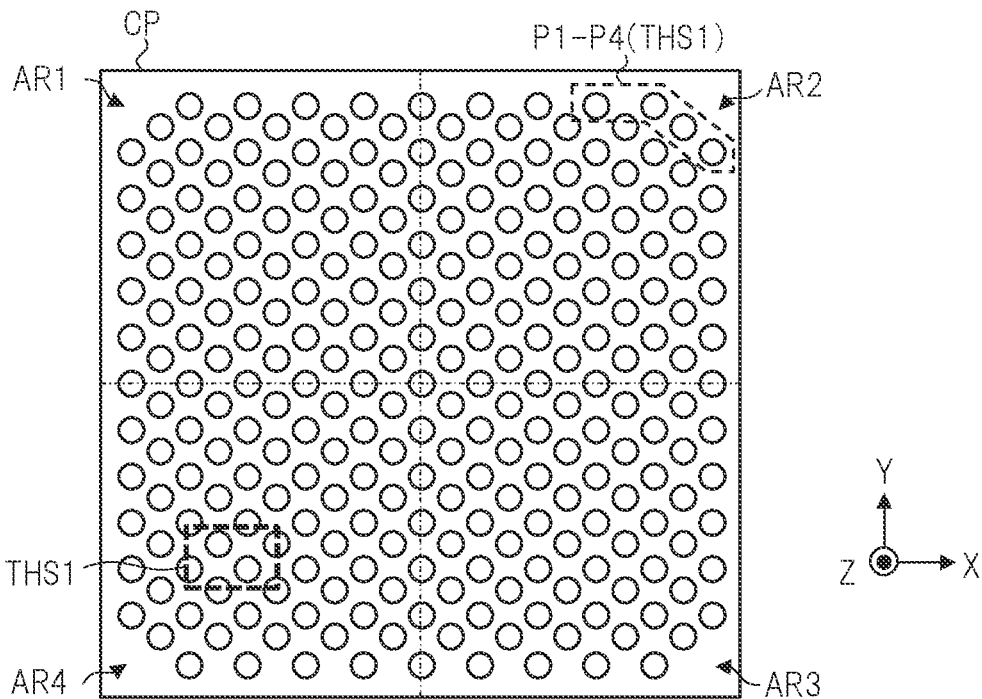
FIG. 11A is a schematic diagram showing an arrangement configuration example of temperature sensor circuit and sensor terminal in the semiconductor device according to the second embodiment.
Figure 11B:
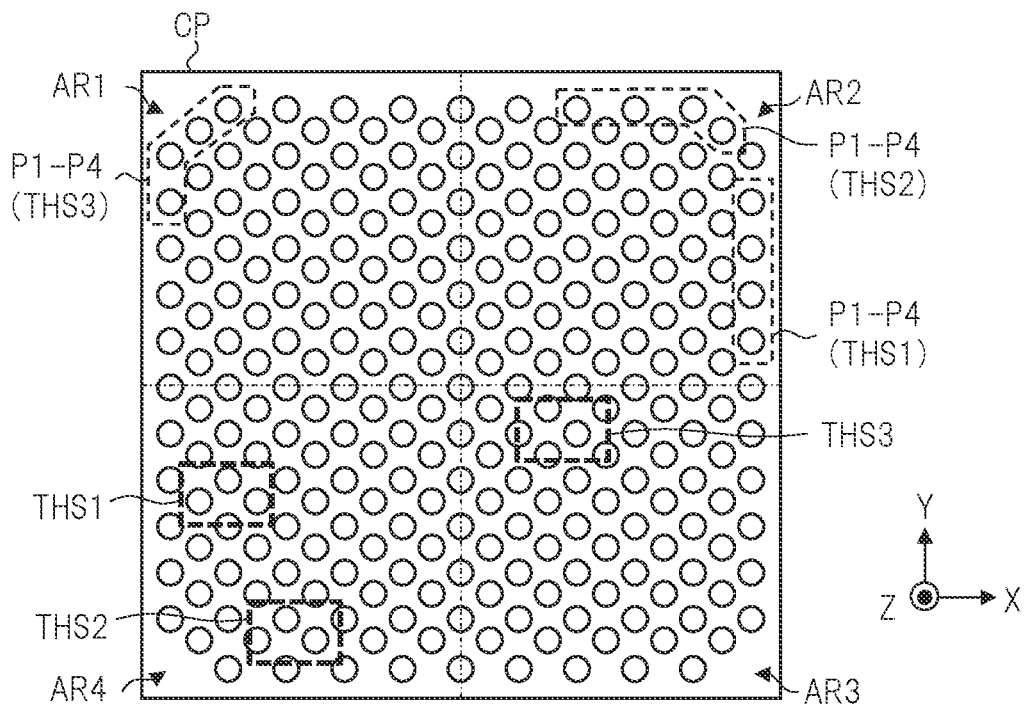
FIG. 11B is a schematic diagram showing another arrangement configuration example of temperature sensor circuit and sensor terminal in the semiconductor device according to the second embodiment.

FIG. 11A and FIG. 11B are schematic diagrams each showing an arrangement configuration example of temperature sensor circuit and sensor terminal in the semiconductor device according to the second embodiment. In FIG. 11A and FIG. 11B, here, the semiconductor device, that is, the semiconductor chip CP is divided into two equal parts in the X-axis direction and the Y-axis direction, respectively, thereby partitioning it into four regions AR1 to AR4. The region AR1 is adjacent to the region AR2 in the X-axis direction and adjacent to the region AR4 in the Y-axis direction. The region AR3 is adjacent to the region AR4 in the X-axis direction and adjacent to the region AR2 in the Y-axis direction. As a result, the regions AR1 and AR3 become point-symmetrical regions, and the regions AR2 and AR4 also become point-symmetrical regions.

FIG. 11A shows an arrangement configuration example in the case where the semiconductor chip CP includes one set of the temperature sensor circuit THS and the sensor terminals P1 to P4. As shown in FIG. 11A, one of the temperature sensor circuit THS1 and the sensor terminals P1 to P4 is arranged in one of the two point-symmetrical regions among the four regions AR1 to AR4, and the other of the temperature sensor circuit THS1 and the sensor terminals P1 to P4 is arranged in the other of the two point-symmetrical regions.

In this example, the temperature sensor circuit THS1 is arranged in the region AR4, and the sensor terminals P1 to P4 are arranged in the region AR2. Furthermore, the sensor terminals P1 to P4 are arranged at a position near the outer periphery of the semiconductor chip CP in the region AR2 where they are arranged. In this example, they are arranged on the outermost periphery of the semiconductor chip CP. Note that terminals other than the sensor terminals P1 to P4 are normal terminals connected to the internal circuits described with reference to FIG. 2.

Here, the sensor terminals P1 to P4 are terminals to which heat of ambient temperature or the like is conducted via the probes PB1 as described in FIG. 1 and the like. In this case, the influence of the heat in the sensor terminals P1 to P4 on the temperature sensor circuit THS1 can be more reduced as the distance between the temperature sensor circuit THS1 and the sensor terminals P1 to P4 becomes longer. Namely, in the first state ST1 shown in FIG. 5A, the error between the temperature of the sensor element SE and the set temperature of the stage 20 can be reduced. Therefore, it is beneficial to use the arrangement configuration example shown in FIG. 11A.

FIG. 11B shows an arrangement configuration example in the case where the semiconductor chip CP includes plural sets, here, three sets of the temperature sensor circuit THS and the sensor terminals P1 to P4. This case is also the same as the case of FIG. 11A, and the temperature sensor circuit THS and the sensor terminals P1 to P4 in each set are separately arranged in the two point-symmetrical regions.

In this example, the temperature sensor circuit THS1 is arranged in the region AR4 and its sensor terminals P1 to P4 are arranged in the region AR2. The temperature sensor circuit THS2 and its sensor terminals P1 to P4 are also arranged in the same manner as the temperature sensor circuit THS1 and its sensor terminals P1 to P4. Further, the temperature sensor circuit THS3 is arranged in the region AR3, and its sensor terminals P1 to P4 are arranged in the region AR1. Also in this case, the sensor terminals P1 to P4 of each of the temperature sensor circuits THS1 to THS3 are arranged on the outermost periphery of the semiconductor chip CP.

Main Effect of Second Embodiment

As described above, when the semiconductor device according to the second embodiment is used, the ESD protection element is provided for the sensor terminal, and it is thus possible to protect the temperature sensor circuit from static electricity during the inspection. Further, since the temperature sensor circuit and the sensor terminals are arranged at the positions away from each other, the influence of the heat in the sensor terminals on the temperature sensor circuit can be reduced, and the actual temperature characteristics of the sensor element can be calculated more accurately. As a result, it becomes possible to accurately correct the temperature characteristics of the temperature sensor circuit in the semiconductor device.

Third Embodiment

<Method of Inspecting Semiconductor Device>

Figure 12:
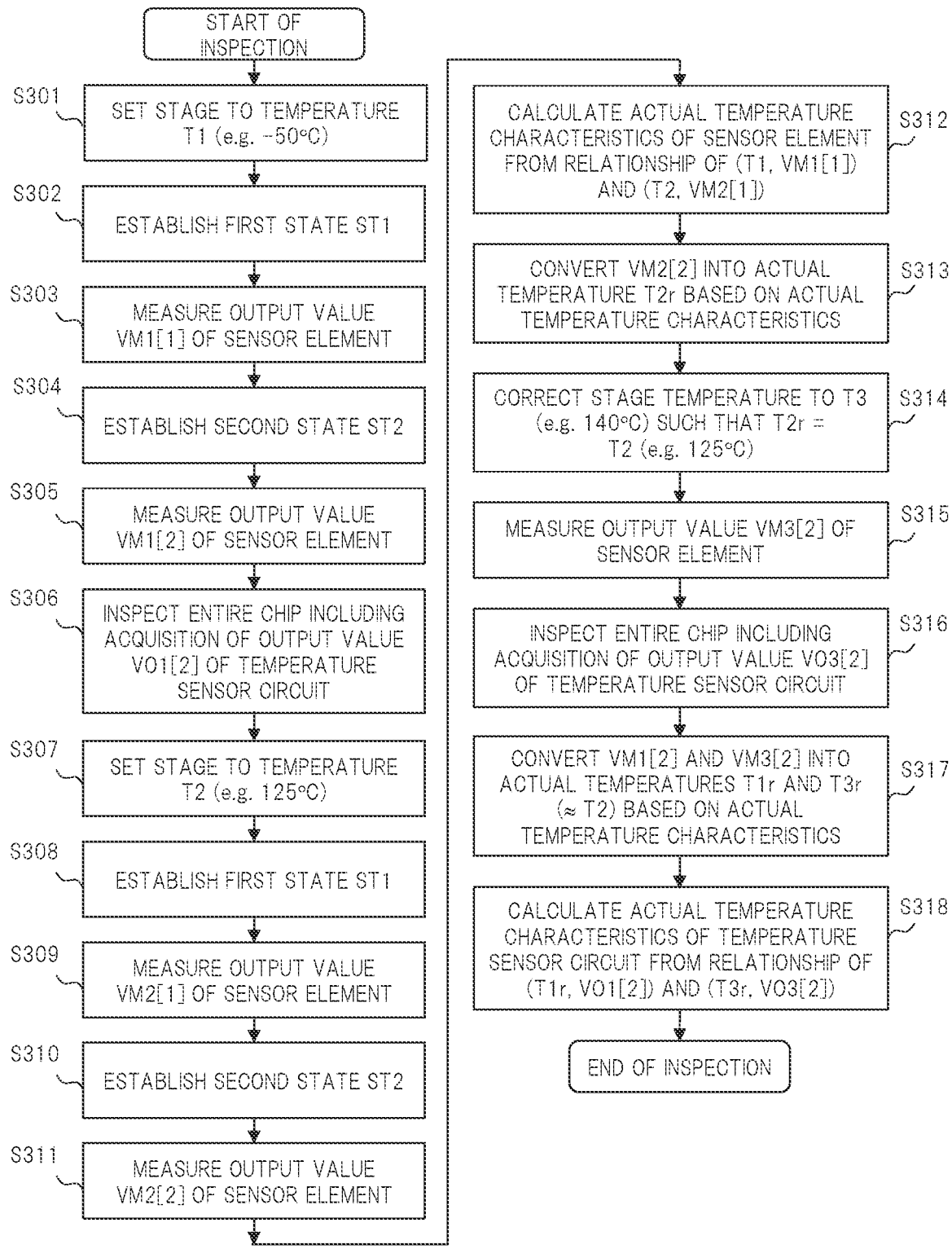
FIG. 12 is a flow diagram showing an example of a method of inspecting a semiconductor device according to the third embodiment.
Figure 13:
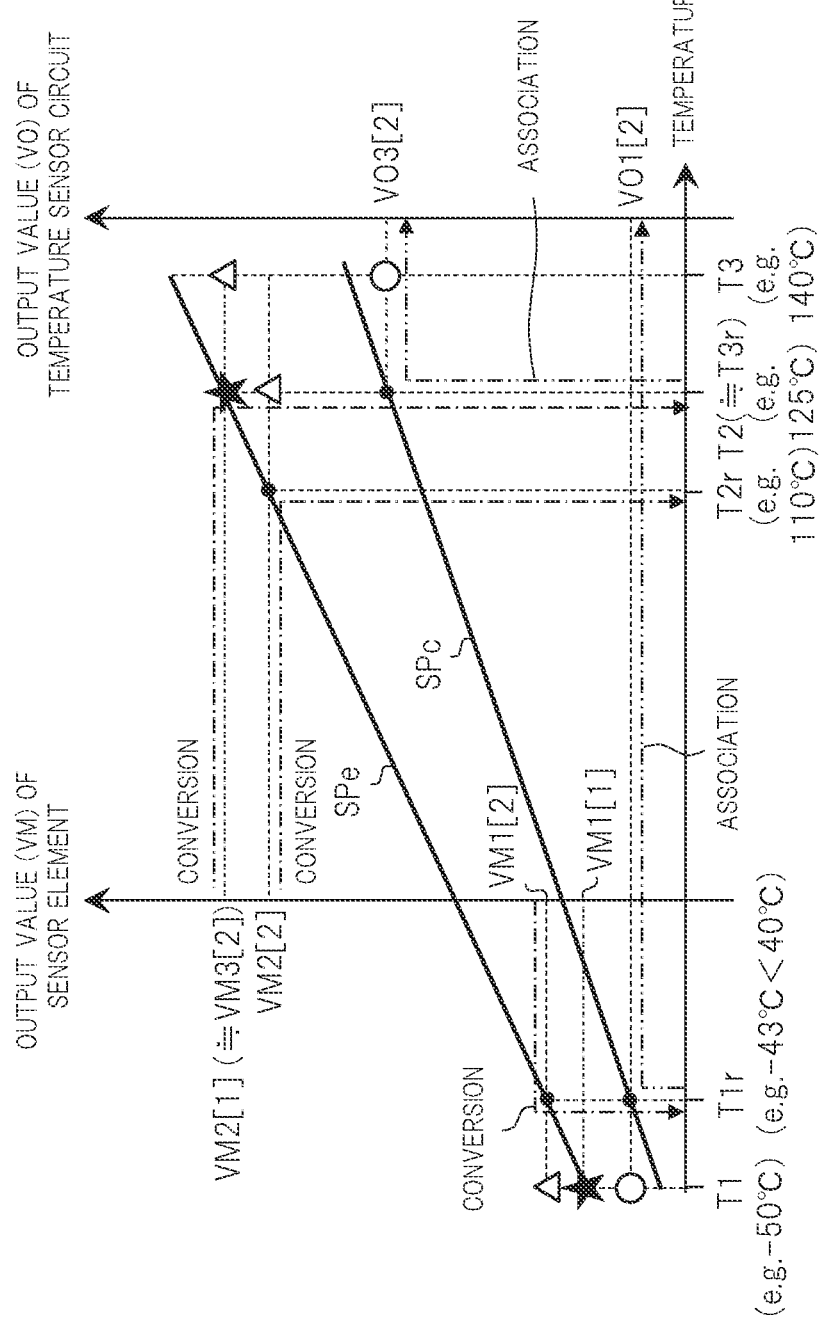
FIG. 13 is a schematic diagram for describing the contents in the process shown in FIG. 12.

FIG. 12 is a flow diagram showing an example of a method of inspecting a semiconductor device according to the third embodiment. FIG. 13 is a schematic diagram for describing the contents in the process shown in FIG. 12. FIG. 13 shows the relationship between the temperature and the output value VM of the sensor element SE and the output value VO of the temperature sensor circuit THS as in the case of FIG. 8. For example, in the inspection method shown in FIG. 7 and FIG. 8, the inspection is performed in the state where the actual temperature of the semiconductor chip CP and the set temperature of the stage 20 are different from each other in the second state ST2. As a result, there is a possibility that the actual inspection temperature of the semiconductor chip CP, for example, 110° C. in FIG. 8 is different from the original inspection temperature, for example, 125° C.

Therefore, in the third embodiment, when the inspection is performed in the second state ST2, the semiconductor inspection apparatus sets the temperature of the stage 20 based on the actual temperature characteristics SPe of the sensor element SE such that the actual temperature of the sensor element SE and thus the semiconductor chip CP becomes the original inspection temperature. As an example, FIG. 12 and FIG. 13 show the method of setting the inspection temperature on a high-temperature side to the original inspection temperature.

In FIG. 12, first, the prober 2 sets the stage 20 to a predetermined set temperature T1, for example, −50° C. by using the temperature adjustment mechanism 21 (step S301). Unlike the case of step S101 in FIG. 7, the set temperature T1 at this time is a value experimentally determined in advance such that the actual temperature T1r of the sensor element SE in the second state ST2 is close to the original inspection temperature, for example, −40° C. However, the set temperature T1 is set so as not to be the under-engineering inspection temperature, that is, the temperature higher than −40° C.

Subsequently, in steps S302 to S311, the same process as that in steps S102 to S111 shown in FIG. 7 is performed. Namely, by using the first state ST1, the output value VM1[1] of the sensor element SE at the temperature T1 and the output value VM2[1] at the temperature T2, for example, 125° C. are measured (steps S303 and S309). Also, by using the second state ST2, the output value VM1[2] of the sensor element SE at the temperature T1 and the output value VM2[2] at the temperature T2 are measured (steps S305 and S311). Further, by using the second state ST2, the output value VO1[2] of the temperature sensor circuit THS at the temperature T1 is acquired (step S306).

Thereafter, the tester 1 calculates the actual temperature characteristics SPe of the sensor element SE shown in FIG. 13 based on the output value VM of the sensor element SE in the state ST1, that is, the output value VM1[1] at the set temperature T1 and the output value VM2[1] at the set temperature T2 as in the case of the step S113 in FIG. 7 (step S312). Subsequently, based on the calculated actual temperature characteristics SPe of the sensor element SE, the tester 1 converts the output value VM2[2] of the sensor element SE measured in step S311, that is, the measured value at the temperature T2 and in the second state ST2 into the actual temperature T2r (step S313).

Next, the tester 1 and the prober 2 correct the set temperature of the stage from the temperature T2 to the temperature T3 such that the actual temperature T2r, for example, 110° C. becomes the temperature T2, for example, 125° C. which is the original inspection temperature (step S314). As an example of a specific correction method, the tester 1 first calculates the error between the set temperature T2 and the actual temperature T2r, and instructs the prober 2 to increase the set temperature of the stage 20 by this error.

Then, the tester 1 adjusts the set temperature of the stage 20 via the prober 2 such that the same value as the output value VM2[1] obtained in step S309 can be obtained, while sequentially monitoring the output value VM3[2] of the sensor element SE in the state where the set temperature of the stage 20 is increased and in the second state ST2.

Here, the output value VM2[1] of the sensor element SE obtained in step S309 is a value representing that the actual temperature is the temperature T2, that is, 125° C. Therefore, the corrected set temperature T3 of the stage 20 obtained in step S314, for example, 140° C. is a value for setting the actual temperature T3r of the sensor element SE in the second state ST2 to the temperature T2, which is the original inspection temperature, that is, 125° C.

In this way, in the state where the set temperature of the stage 20 is corrected to the temperature T3 and in the second state ST2, the tester 1 measures the output value VM3[2] of the sensor element SE via the probes PB1 (Step S315). In parallel with this, the tester 1 performs the inspection of the entire semiconductor chip CP, that is, the inspection of the internal circuits described with reference to FIG. 2 including acquisition of the output value VO3[2] of the temperature sensor circuit THS via the probes PB2 (step S316).

Next, the tester 1 converts the output value VM1 [2] of the sensor element SE in step S305 obtained in the second state ST2, that is, the measured value at the set temperature T1 and the output value VM3[2] of the sensor element SE in step S315, that is, the measured value at the set temperature T3 into the actual temperatures T1r and T3r based on the actual temperature characteristics SPe (step S317). In the example of FIG. 13, the actual temperature T1r is −43° C. Also, the actual temperature T3r becomes a value substantially equal to the temperature T2, that is, 125° C.

Subsequently, the tester 1 associates the output value VO1[2] of the temperature sensor circuit THS in step S306 obtained in the second state ST2, that is, the acquired value at the set temperature T1 and the output value VO3[2] of the temperature sensor circuit THS in step S316, that is, the acquired value at the set temperature T3 with the actual temperatures T1r and T3r converted in step S317, respectively. Then, based on this association, the tester 1 calculates the actual temperature characteristics SPc of the temperature sensor circuit THS shown in FIG. 13 (step S318).

Note that the method of correcting the set temperature of the stage 20 is not limited to the method shown in FIG. 12 and FIG. 13, and various methods are applicable as long as they are based on the actual temperature characteristics SPe of the sensor element SE calculated by using the first state ST1. For example, for one semiconductor chip CP in a certain semiconductor wafer WF, the actual temperature characteristics SPe of the sensor element SE are calculated in advance by using the first state ST1. Further, for the semiconductor chip CP, in the second state ST2, a set temperature of the stage that makes the actual temperature of the sensor element SE equal to the original test temperature is searched in advance based on the actual temperature characteristics SPe. At this time, for example, the same method as that in step S314 can be used.

As described above, for example, if the types of the semiconductor chip CP and the semiconductor wafer WF do not change and the type of the semiconductor inspection apparatus does not change, the set temperature of the stage 20 after correction obtained for one semiconductor chip CP can be utilized in common. In this case, it is only necessary to apply the corrected set temperature of the stage 20 to the temperatures T1 and T2 in steps S101 and S107 in FIG. 7.

Main Effect of Third Embodiment

As described above, by using the method of the third embodiment, in addition to various effects described in the first embodiment, the inspection of the semiconductor device can be performed while setting the actual temperature of the semiconductor device to the original inspection temperature. As a result, it is possible to ensure the quality of the semiconductor device more reliably.

In the foregoing, the invention made by the inventors of this application has been concretely described based on the embodiments. However, it is needless to say that the present invention is not limited to the foregoing embodiments and various modifications can be made within the scope not departing from the gist of the present invention.

What is claimed is:

1. A method of inspecting a semiconductor device using a semiconductor inspection apparatus,
   wherein the semiconductor device includes:
     a temperature sensor circuit which includes a sensor element whose output value changes depending on temperature and detects a temperature of the semiconductor device based on the output value of the sensor element;
     internal circuits for realizing various functions of the semiconductor device;
     sensor terminals connected to the sensor element; and
     normal terminals connected to the internal circuits,
   wherein the semiconductor inspection apparatus
     inspects, by using a probe card in which first probes whose length can be set to a first length and a second length shorter than the first length and second probes whose length is set to the second length are provided, the semiconductor device mounted on a stage in a first state in which the first probe is in contact with the sensor terminal and the second probe is not in contact with the semiconductor device and in a second state in which the first probe is in contact with the sensor terminal and the second probe is in contact with the normal terminal,
     sets temperature of the stage to two or more temperatures,
     measures the output value of the sensor element by using the first state at each of the temperatures and regards the temperature of the stage as an actual temperature of the sensor element,
     calculates a first actual temperature characteristics representing a relationship between the actual temperature of the sensor element and the output value of the sensor element,
     measures the output value of the sensor element and an output value of the temperature sensor circuit by using the second state at each of the temperatures,
     converts the output value of the sensor element into the actual temperature of the sensor element based on the first actual temperature characteristics,
     calculates a second actual temperature characteristics representing a relationship between the actual temperature of the sensor element and the output value of the temperature sensor circuit, and
     regards the actual temperature of the sensor element as an actual temperature of the semiconductor device by converting the output value of the temperature sensor circuit into the actual temperature of the sensor element based on the second actual temperature characteristics when inspecting the semiconductor device.

2. The method of inspecting the semiconductor device according to claim 1,
wherein the sensor terminals include:
a first sensor terminal and a second sensor terminal for applying a bias to the sensor element from outside; and
a third sensor terminal and a fourth sensor terminal for externally measuring the output value generated in the sensor element in response to the application of the bias,
wherein the first probes include four probes in contact with the first to fourth sensor terminals, respectively, and
wherein the semiconductor inspection apparatus applies the bias to the first sensor terminal and the second sensor terminal via the first probes and measures the output value of the sensor element generated in the third sensor terminal and the fourth sensor terminal via the first probes.

3. The method of inspecting the semiconductor device according to claim 2,
wherein the bias applied to the sensor element is a current, and
wherein the output value of the sensor element is a voltage value.

4. The method of inspecting the semiconductor device according to claim 1,
wherein the semiconductor inspection apparatus includes a prober and a tester,
wherein the prober
establishes the first state or the second state by driving the stage,
transmits a first inspection start command to the tester when the first state is established,
establishes the second state in response to a first inspection end notification received from the tester in response to the first inspection start command, and
transmits a second inspection start command to the tester when the second state is established, and
wherein the tester
measures the output value of the sensor element by executing a first inspection program in response to the first inspection start command from the prober,
transmits the first inspection end notification to the prober after measuring the output value of the sensor element,
inspects the semiconductor device including the measurement of the output value of the sensor element and the output value of the temperature sensor circuit by executing a second inspection program in response to the second inspection start command from the prober, and
transmits a second inspection end notification to the prober after finishing the inspection of the semiconductor device.

5. The method of inspecting the semiconductor device according to claim 1, wherein the number of the normal terminals is one thousand or more.

6. A semiconductor device comprising:
a temperature sensor circuit which includes a sensor element whose output value changes depending on temperature and detects a temperature of the semiconductor device based on the output value of the sensor element;
internal circuits for realizing various functions of the semiconductor device;
sensor terminals which are a part of inspection terminals to outside and are connected to the sensor element; and
normal terminals which are another part of the inspection terminals and are connected to the internal circuits,
wherein the sensor terminals include:
a first sensor terminal and a second sensor terminal for applying a bias to the sensor element from outside; and
a third sensor terminal and a fourth sensor terminal for externally measuring the output value generated in the sensor element in response to the application of the bias.

7. The semiconductor device according to claim 6 further comprising:
an ESD (Electro Static Discharge) protection element inserted in series in a wiring between the sensor element and the sensor terminal.

8. The semiconductor device according to claim 6,
wherein, when the semiconductor device is divided into two equal parts in a first direction and a second direction orthogonal to the first direction, respectively, thereby partitioning it into four regions,
wherein one of the temperature sensor circuit and the sensor terminals is arranged in one of two point-symmetrical regions among the four regions, the other of the temperature sensor circuit and the sensor terminals is arranged in the other of the two point-symmetrical regions, and the sensor terminals are arranged at a position near an outer periphery of the semiconductor device in the region where they are arranged.

9. The semiconductor device according to claim 8,
wherein plural sets of the temperature sensor circuit and the sensor terminals are provided, and
wherein, in each of the plural sets, one of the temperature sensor circuit and the sensor terminals is arranged in one of the two point-symmetrical regions, the other of the temperature sensor circuit and the sensor terminals is arranged in the other of the two point-symmetrical regions, and the sensor terminals are arranged at a position near the outer periphery of the semiconductor device in the region where they are arranged.

10. The semiconductor device according to claim 6, wherein the semiconductor device is an SOC (System On a Chip) including a processor and a memory as the internal circuits.

11. A probe card used in a semiconductor inspection apparatus comprising:
first probes whose length can be set to a first length and a second length shorter than the first length; and
second probes whose length is set to the second length,
wherein it is possible to establish a first state in which the first probe is in contact with a semiconductor device which is non-inspection device and the second probe is not in contact with the semiconductor device and a second state in which both the first probe and the second probe are in contact with the semiconductor device,
wherein the semiconductor device includes a sensor element whose output value changes depending on temperature, sensor terminals connected to the sensor element, internal circuits for realizing various functions of the semiconductor device, and normal terminals connected to the internal circuits,
wherein the first probes are probes to be in contact with the sensor terminals, and wherein the second probes are probes to be in contact with the normal terminals.

12. The probe card according to claim 11,
wherein the first probe includes:
- a first barrel;
- a first spring housed in the first barrel; and
- a first plunger which is inserted into the first barrel and whose insertion amount is limited by the first spring, and wherein the second probe includes:
- a second barrel having the same length as that of the first barrel;
- a second spring housed in the second barrel and harder than the first spring; and
- a second plunger which is inserted into the second barrel and is shorter than the first plunger and whose insertion amount is limited by the second spring.

* * * * *